United States Patent [19]

Guldi

[11] Patent Number: 5,525,529
[45] Date of Patent: Jun. 11, 1996

[54] METHOD FOR REDUCING DOPANT DIFFUSION

[75] Inventor: Richard L. Guldi, Dallas, Tex.

[73] Assignee: Texas Instruments Incorporated, Dallas, Tex.

[21] Appl. No.: 340,770

[22] Filed: Nov. 16, 1994

[51] Int. Cl.⁶ .................................................. H01L 21/266
[52] U.S. Cl. ...................... 437/28; 437/976; 148/DIG. 7
[58] Field of Search .............................. 437/28, 95, 931, 437/976, 34; 148/DIG. 7

[56] References Cited

U.S. PATENT DOCUMENTS

| | | | |
|---|---|---|---|
| 3,945,856 | 3/1976 | Koenig et al. | 437/931 |
| 4,843,023 | 6/1989 | Chiu et al. | 437/28 |

OTHER PUBLICATIONS

Ahn, S. T., et al, *Reduction of Lateral Phosphorus in CMOS n–Wells*, IEEE Transactions on Electron Devices, vol.37 No. 3, Mar. 1990, pp. 806–807.

Wong, S. S. and Ekstedt, T. W., CMOS Well Drive–In in $NH_3$ for Reduced Lateral Diffusion and Heat Cycle, IEEE Electron Device Letters, vol., EDL–6, No. 12, Dec. 1985, pp. 659–661.

Ghardhi, "VLSI Fabrication Principles", 1983, pp. 113–118, 325–328, 353–354, 372–373, 420–424, 427–429.

Primary Examiner—Chandra Chaudhari
Attorney, Agent, or Firm—Paul C. Hashim; Wade J. Brady, III; Richard L. Donaldson

[57] ABSTRACT

A process is disclosed for inhibiting undesired diffusion of implanted dopants during and after dopant activation, as can occur during source/drain anneal. Undesired dopant diffusion is minimized by a dopant blocking layer, which is applied to the semiconductor body prior to dopant activation, and preferably prior to dopant implantation. The composition of the blocking layer is selected in accordance with the diffusion mechanism of the dopant to be implanted so that the concentration of lattice vacancies or interstitials (depending upon the dopant diffusion mechanism) is reduced, thereby inhibiting undesired migration of the implanted species.

20 Claims, 2 Drawing Sheets

METHOD FOR REDUCING DOPANT DIFFUSION

TECHNICAL FIELD OF THE INVENTION

This invention relates generally to the formation of integrated circuits, and more particularly to undesired diffusion of dopants following their introduction into a semiconductor device, as would be undertaken during the formation of conducting silicon regions such as the source/drain regions of CMOS and other types of integrated circuits.

BACKGROUND OF THE INVENTION

The manufacture of integrated circuit devices involves the formation of wells and other regions in a substrate that are doped with various impurities, such as Boron, Arsenic and Phosphorus. These regions form the site where transistor and transistor components will be fabricated. Regions that are doped with n-type impurities, such as Phosphorus or Arsenic, give rise to p-channel transistors, whereas regions lying outside of n-wells (called p-wells) that are doped with p-type impurities, such as Boron, provide a site for fabricating n-channel transistors. Both n-channel and p-channel transistors are required to implement CMOS technology.

Integrated circuit manufacture provides for the formation of active regions that are separated by distances of about 1 μm or greater by field oxide layers having a thickness of about 400–1200 nm. Transistors and other electrical structures are formed in the active regions. The field oxide provides for electrical isolation between separate and distinct electrical device regions on a die.

As the state of the art advances, a greater number of circuit components are to be provided on smaller surface areas of the die. However, as die size and die component separation are reduced, it becomes increasingly difficult to maintain electrical isolation between electronic components formed on the die, due principally to the problem of lateral diffusion when diffusion principally in the vertical direction is desired. Undesired vertical diffusion is also problematic, especially in devices having junctions on the order of 0.1 μm or less. As thermal processing tends to drive junctions deeper into the substrate, device performance can be compromised. This is especially true during high temperature annealing, which is required to activate impurities implanted in the transistor service/drain regions.

It is well known that Boron and Phosphorus diffuse predominantly by interactions with silicon interstitials. In contrast, Arsenic and Antimony are known to diffuse principally through interactions with lattice vacancies. Therefore, the manner in which the dopant diffuses into the semiconductor device affects not only the structure of the adjacent regions into which the dopant diffuses, but also the measures that one can take to minimize the extent of dopant diffusion. For example, measures taken to inhibit Boron or Phosphorus diffusion could not be expected to have the same impact upon diffusion of Arsenic or Antimony. Likewise, measures taken to inhibit Boron or Phosphorus diffusion could not be expected to have the impact upon diffusion of Arsenic or Antimony, as Arsenic and Antimony diffuse by way of a different mechanisms (lattice vacancies) as opposed to Boron and Phosphorus (interstitials). Moreover, Boron (for p+ source/drains) and Phosphorus (for n+ source/drains) are among the fastest diffusing impurities. Accordingly, as Boron and Phosphorus are widely used for fabricating transistor source/drains, it is desirable to minimize the concentration of substrate interstitials during source/drain annealing. In cases where both Arsenic and phosphorus are used in forming N+ source/drain regions, the faster diffusing species is phosphorus. Therefore, measures taken to reduce Boron and phosphorus diffusion are effective in reducing the overall N+ junction depth.

In conventional CMOS manufacture, active regions are formed by a local oxidation process in which a thin layer of $SiO_2$ is grown in a diffusion furnace and a silicon nitride ($Si_3N_4$) layer is deposited by low pressure chemical vapor deposition ("LPCVD") over the $SiO_2$. The oxide/nitride stack functions as an oxidation blocking layer above what will become the active region of the device. Prior to development of a field oxide outside of the blocking layer, Boron is implanted into areas where the field oxide is to be grown, but not into active regions which are covered by oxide/nitride/photoresist stack. As the Boron is driven into the semiconductor device, the Boron freely diffuses vertically and laterally (by interstitials) into the active region, compromising region integrity for the development of circuit devices.

The problem of dopant diffusion during well drive-in is well documented. Lateral dopant diffusion of approximately 80% well depth is acknowledged in *CMOS Well Drive-In in $NH_3$ for Reduced Lateral Diffusion and Heat Cycle*, IEEE Electron Device Letters, v. EDL-6, no. 12, Dec. 1985. The stated consequence of such undesired diffusion is an increase in the spacing requirement between the well and complementary MOSFET's outside of the well. The article reports retardation of lateral diffusion through the use of an ammonia ambient. Well drive-in is performed at 1,125° C. in either an $N_2$ or an $NH_3$ ambient. With reference to the ammonia ambient, the authors assert that silicon vacancies are generated at the $SiO_2$-substrate interface on the well regions where oxynitridation occurs, thus inhibiting lateral Phosphorus diffusion. Increased silicon vacancy concentration causes a decreased silicon interstitial concentration because the product of Si vacancies times interstitials is equal to an equilibrium constant. The reduced concentration of self-interstitials in the lateral direction is believed to inhibit lateral diffusion of Phosphorus.

More recently, the importance of scaling parasitic dimensions such as isolation regions and well dimensions has been addressed in *Reduction of Lateral Phosphorus Diffusion in CMOS n-Wells*, IEEE Transactions on Electron Devices, v. 37, no. 3, March 1990. Lateral diffusion of dopants during drive-in is identified as a primary factor that limits packaging density of semiconductor devices. Lateral diffusion of Phosphorus is reduced by creating silicon interstitial undersaturation in the region where the Phosphorus atoms diffuse laterally, as such Phosphorus atoms diffuse predominantly by interaction with self-interstitials. Lateral diffusion of Phosphorus is controlled by creating vacancy supersaturation arising from the decomposition reaction of $SiO_2$ ultimately to SiO, which results in the consumption of silicon atoms. The known prior art, however, does not address the problem of source/drain drive-in incident to the anneal process for activating implanted dopants and for repairing crystalline lattice damage arising from dopant implantation. This problem becomes particularly acute as industry plans for the development of sub-micron technology.

SUMMARY OF THE INVENTION

An advantage of the present invention is that undesired dopant diffusion can be reduced by applying films of differing chemical configurations over semiconductor regions such as transistor source/drains prior to dopant activation annealing. Dopant activation occurs during the course of annealing, which is undertaken to cure structural damage that arises from the introduction of dopants. Vertical and lateral diffusion is suppressed by controlling the silicon interstitial concentration during source/drain anneal by application of a film of a specified composition over the source/drain regions for use during the anneal process. Upon exposure to the anneal treatment temperature, and optionally in the presence of a conditioning environment, the films act to reduce the interstitial concentration in the underlying active source/drain regions to limit diffusion of interstitial-transmissive dopants such as Boron and Phosphorus. Analogous films and conditioning environments can be applied to limit the diffusion of vacancy-transmissive dopants such as Arsenic and Antimony. The teachings of the present invention are applicable to semiconductor devices that are formed from silicon, as well as those that are formed from other semiconductive materials, such as GaAs and HgCdTe. Selection of an appropriate film in conjunction with a particular dopant minimizes the extent of dopant diffusion into the source/drain region of the device, thereby controlling junction drive into the semiconductor device.

A process is provided for inhibiting dopant diffusion in a semiconductive material. At least one diffusion blocking layer or stack is provided along the semiconductor body so as to overlie the source/drain and depress the concentration of interstitial or vacancies in the underlying source/drain in accordance with the diffusion mechanism of the selected dopant. Dopant is introduced into the oxide layer of the semiconductor body, such a by way of diffusion or ion implantation. The depressed levels of interstitials or vacancies serve to inhibit diffusion of the dopant into the body of the semiconductor, thereby inhibiting drive of the source/drain regions further into the body of the semiconductor. The device is heated to a temperature of about 800° C. or greater to activate the doped impurities (i.e., the impurities diffuse to Si lattice sites instead of occupying interstitial positions in instances where Boron and Phosphorus are introduced) while also annealing the substrate to cure defects that arise from dopant implantation.

Interstitial sites or vacancies in the source/drain regions are suppressed by adjusting the chemical composition of the overlying blocking layer, and thus the relationship between the blocking layer and the underlying semiconductor source/drain region. For example, the blocking layer can be in the form of a thin native oxide on the order of ~1–3 nm thick. Alternatively, the blocking layer can comprise a silicon deficient film such as a silicon deficient oxide ($SiO_x$), in which "x" is greater than 2. The silicon deficient oxide absorbs silicon atoms from the underlying source/drain when the device is heated to a temperature of about 800° C., thereby depressing the silicon interstitial concentration. Alternatively, the blocking layer can include a silicon deficient oxynitride film having the composition $SiO_uN_v$ that underlies a silicon nitride film, in which "u" and "v" represent fractional components selected to render a silicon deficient film. The blocking layer can also be in the form of a thin (~1–3 nm) thick native oxide and the anneal can be conducted in an $NH_3$ ambient. Nitridation effects arising from the $NH_3$ ambient promote vacancy formation in the underlying silicon. The blocking layer can also be in the form of a screen oxide or screen oxynitride layer, both of which can be on the order of ~5–50 nm thick, and the anneal can be conducted in an $NH_3$ ambient. Nitridation of the screen layer promotes vacancy formation in the underlying silicon, thus retarding source/drain drive.

In a further aspect of the invention, the blocking layer can be in the form of an oxide film that underlies a silicon nitride film having the composition $Si_3N_y$, with y>4. The silicon nitride absorbs silicon atoms from the underlying source/drain regions. The silicon nitride can be applied by plasma deposition or low pressure chemical vapor deposition ("LPCVD") utilizing an $NH_3:SiH_2Cl_2$ [Dichloro Silane Gas ("DCS")] ratio of about 10:1 or greater. The underlying oxide film can be produced by thermal oxidation, plasma-assisted deposition, or other appropriate processes.

Another aspect of the invention comprises a blocking layer having a silicon nitride film having an $SiO_2$ overlay which, in turn, underlies an $Si_3N_4$ film. The lower silicon nitride can be deposited by either LPCVD or by plasma-enhanced deposition. In the latter case, a silicon deficient film is interposed between the nitride and the substrate to leach Si atoms from underlying surface, thereby depleting the Si interstitial concentration. The upper nitride can be deposited by LPCVD. This combination film blocking layer introduces nitride stress into the anneal region to further suppress Boron diffusion.

Any of the foregoing blocking layers can be used in conjunction with an $NH_3$ ambient during anneal, in which instance nitridation arising from the $NH_3$ ambient enhances vacancy formation within the source/drain region, thereby suppressing Boron and Phosphorus diffusion.

The teachings of the present invention are applicable during a number of semiconductor manufacturing processes, including source/drain anneal, to suppress dopant diffusion, as Boron and Phosphorus diffuse by common mechanisms (i.e., vertical and lateral diffusion are retarded by the injection of silicon vacancies into the silicon underlying the circuit component stack).

BRIEF DESCRIPTION OF THE DRAWINGS

These and other features of the invention will be apparent to those skilled in the art from a reading of the following detailed description of the invention, taken together with the accompanying drawings, in which the illustrated semiconductor components have not been depicted to scale for reasons of clarity of depiction and reader comprehension, and in which.

DETAILED DESCRIPTION OF THE PREFERRED EMBODIMENTS

Figure 1:
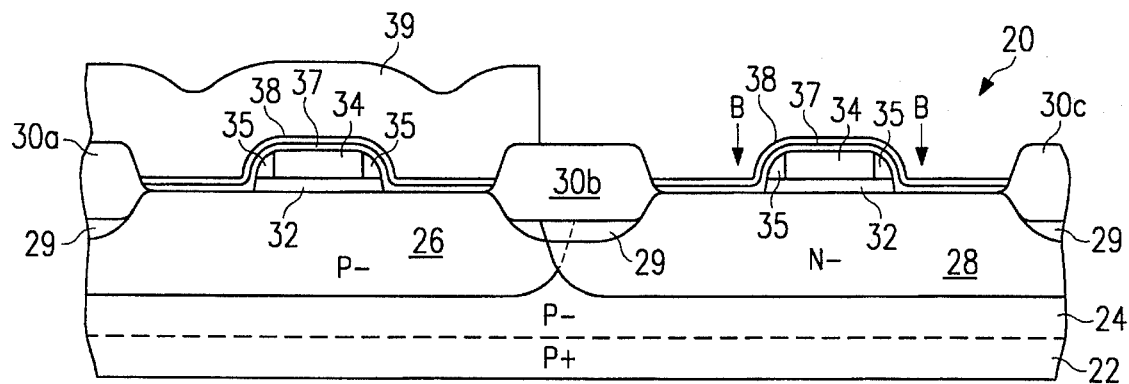
FIG. 1–3 illustrate the process of source/drain anneal in accordance with an aspect of the present invention.

With reference to the drawings, wherein like reference characters represent corresponding views throughout the various illustrations, and with particular reference to FIG. 1, there is illustrated a sectional view of a CMOS semiconductor device depicted generally by reference character 20, that is comprised of a body 22 of semiconductive material, such as silicon. The semiconductor body 22 can also be formed from a variety of other semiconductive materials, such as GaAs and HgCdTe, for which the principles of the present invention that are set forth below are likewise applicable. The principles of the present invention are also applicable for other types of semiconductor devices, such as NMOS and BiCMOS devices. FIG. 1 illustrates a conventional CMOS device prior to implantation of the source/drain regions. As such, the depicted semiconductor device 20 can be formed from any of a variety of known processes for which implantation of source/drain regions is desirable.

The semiconductor body 22 is in the form of a p+ substrate over which is applied a thin p– epitaxial silicon layer 24 of about 0.3–10 um. A p– well 26 and corresponding n– tank 28 are formed in the epitaxial silicon 24. A Boron implant is performed to create p– channel stop regions 29. Field oxide regions 30a–30c are thermally grown to a thickness of about 400–1000 nm, separating discrete well and tank regions 26 and 28, respectively, or discrete active regions within the same type of well. Centrally disposed in overlying relation with each well 26 and tank 28 region is a gate oxide 32 that is thermally grown to a thickness of about 8–40 nm. A layer of polysilicon (not shown) is then deposited over the gate oxide 32 and doped n+ with an impurity such as phosphorus to render it conductive. The polysilicon is then patterned with photoresist and etched to remove the unprotected polysilicon thereby defining a conductive gate 34. A thin oxide of about 10–30 nm is deposited over the polysilicon, after which a nitride can be deposited and etched to form sidewall spacers 35. The underlying oxide 32 can be removed using HF or a plasma etch. Alternatively, if the underlying oxide is silicon deficient, it can be left in place to further inhibit dopant diffusion in a manner that is described in detail below.

Prior to implantation to the source/drain regions, a screen insulating layer 37 can optionally be applied over the epitaxial layer 24 for the purpose of preventing undesirable species, such as metal impurities, from penetrating the silicon layer of the tank 28 during source/drain implantation. The screen insulating layer 37 can be formed of an oxide, nitride, or oxynitride, for example, and can be rendered having a thickness of about 20–40 nm. The species inhibited by the insulating layer 37 typically have a lower energy than the species to be implanted during source/drain implantation and therefore do not penetrate through the insulating layer 37.

In accordance with the present invention, a blocking layer 38 (FIGS. 1 and 2) is applied over the gate 34 and adjacent epitaxial surfaces defining well 26 and tank 28 regions to inhibit lateral and vertical diffusion of doped impurities during source/drain anneal. As will be described in greater detail below, the invention provides single and multi-film blocking layers, all of which are operable to inhibit undesired dopant diffusion. Alternatively, application of the blocking layer 38 can be deferred until after source/drain implantation, in accordance with the physical and chemical characteristics of the substrate and the dopant to be implanted.

In the illustration of FIG. 1, a comparatively thick layer 39 of a photoresistive substance ("photoresist") overlies the p– well region 26 and field oxide 30a & 30c, incident to implantation of source/drain regions in the tank region 28. Accordingly, the n– tank region 28 is not covered with a photoresistive layer 44. As has been mentioned previously, all of the foregoing semiconductor device components or regions 22–36 are conventional in nature and can be formed in any of a variety of conventional processes prior to practice of the present invention, the only limitation being that imposed by the type of device (i.e., NMOS, CMOS and BiCMOS) that is to be constructed.

Implantation into the tank 28 of source/drain regions 40 and 42, respectively, is accomplished in a conventional manner. In the illustrated embodiment, Boron, a p+ donor impurity, is implanted into the tank 28, as indicated by the arrows. For CMOS devices, a Boron dosage of about 0.5–3E15 atoms/cm$^2$ at 10–35 KeV is provided.

Figure 2:
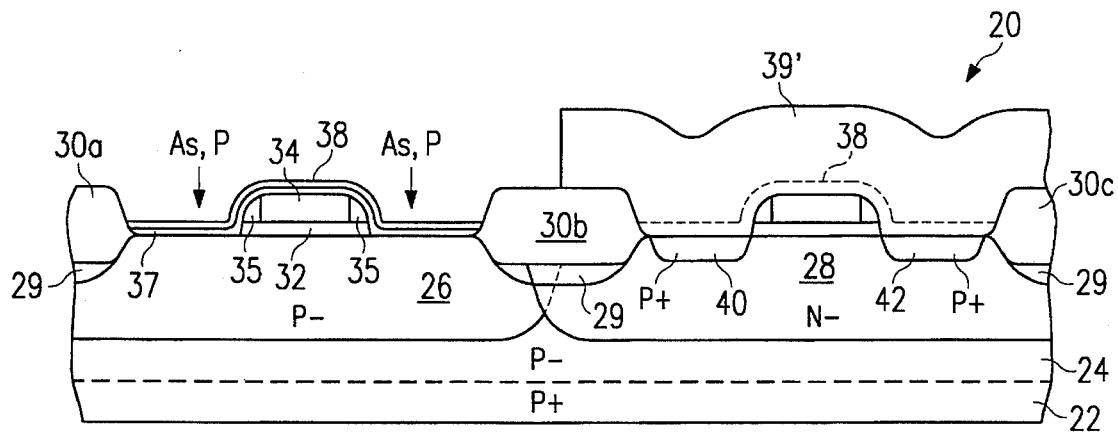
Figure 3:
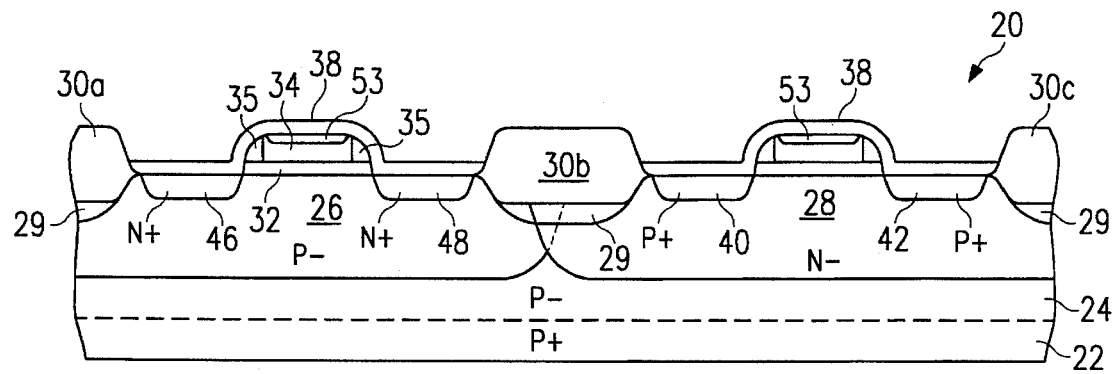

With reference to FIG. 2, source/drain regions 40 and 42, respectively, are illustrated as having been formed in tank 28. Photoresist layer 36 overlying well 26 has been removed, and a new photoresist layer 36' has been applied so as to overlie tank 28. A suitable n+ dopant, such as arsenic, or a combination of dopants, such as arsenic and phosphorus, can be implanted into the well 26, as indicated by the arrows in FIG. 2, so as to form source and drain regions 46 and 48 (FIG. 3), respectively. For a combination dopant implantation of arsenic and phosphorus, the arsenic dosage can be about 0.5–3E15 atoms/cm$^2$ at 50–100 KeV while the phosphorus can be 0.5–4E13 at about 40–100 KeV.

Source/drain implantation heavily damages the silicon in the vicinity of the source/drain regions 40, 42 and 46, 48. The damage to the silicon in many instances causes the silicon to become amorphized. A corrective anneal is undertaken to both electrically activate the source/drain impurity as well as to institute recrystallization of the silicon. The anneal can be performed in either a furnace tube or in a single wafer rapid thermal annealer. Preferably, the anneal is conducted at a temperature of at least about 800° C. A thin film of material, such as Ti or Co, can be deposited onto the gate 34 and reacted with the gate silicon to form a silicide film 53 (FIG. 3) which overlies the gate, and optionally the source/drain regions 40 & 42 and 46 & 48. Further processing can proceed, such as with the deposition of a poly-metal detective (PMD) layer over the device 20 to provide insulation between the gate 34 and source/drain requires 40 & 42 and 46 & 48 and a subsequently applied metal layer (not shown).

The blocking layer 38 overlying the source/drain regions 40 & 42 and 46 & 48 respectively, can have a variety of chemical compositions, all of which serve to inhibit vertical and lateral diffusion of the implanted impurity. The blocking layer is preferably applied so as to overlie both the n+ and p+ source/drain regions simultaneously. However, it is to be appreciated that the blocking layer can be applied to overlie the n+ and p+ source/drain regions in separate, discrete processes to permit, for example, construction of blocking layers of differing compositions to overlie the respective source and drain regions. In one aspect of the invention, the blocking layer 38 (FIG. 3) comprises a thin native oxide ($SiO_2$) of about 1–3 nm thick. The native oxide is developed upon exposure of the source/drain regions 40 & 42 and 46 & 48 to oxygen at room temperature for a period of about 20–60 min. The thickness of the native oxide can increase up to an additional 1–3 nm during the course of subsequent, conventional chemical treatment, such as that which may be undertaken to remove particulate contaminates. Following establishment of the blocking layer 38 in the manner described above, source/drain anneal is then performed in a non-oxidizing atmosphere such as nitrogen to both activate the implanted impurity and to cure structural defects in the substrate that arise from the implantation process. In a preferred aspect of the invention, the furnace temperature is ramped to about 850°–900° C. and maintained at that temperature for a period of from about 20–60 minutes. It is to be appreciated, however, that the foregoing anneal process can be varied in accordance with other suitable annealing schedules and may be implemented in other non-oxidizing atmospheres, such as argon or helium. Moreover, annealing can occur in a rapid thermal processor as opposed to a conventional tubular furnace.

In an alternative aspect to the invention, the blocking layer 38 can comprise a silicon deficient film having the chemical composition $SiO_x$, in which $x > 2$. At annealing temperatures in excess of about 800° C., the silicon-deficient oxide absorbs silicon atoms from the underlying source/ drain regions, thereby depressing the silicon interstitial concentration. The silicon-deficient oxide can be deposited by any of a variety of conventional application processes, including plasma-assisted processes.

A further aspect of the invention comprises configuring the blocking layers 38 as plasma-deposited, silicon-deficient oxynitride film having the chemical composition $SiO_uN_v$, in which u and v represent fractional components selected to render a silicon deficient film. The oxynitride film 38 can be applied as an implant screen which remains intact during the course annealing. Because of the silicon deficiency and the presence of an oxynitride compound, silicon atoms from the surface underlying the blocking layer 38 migrate into the blocking layer, thereby depressing silicon interstitial concentration within the source/drain regions.

In a further aspect of the invention, the blocking layer 38 is configured as a thin native oxide ($SiO_2$) of about 1–3 nm thick, and the anneal is conducted in an ammonia ($NH_3$) ambient. Annealing in an ammonia ambient promotes nitridation effects which cause the formation of vacancies in the underlying silicon. As an implanted impurity such as Boron, requires interstitials in order to diffuse, the present of vacancies in the silicon substrates within and surrounding the source/drain regions 46 and 48 inhibits vertical and lateral impurity diffusion.

In further aspect of the invention, the blocking layer 38 can be configured as a screen oxide ($SiO_2$) or screen oxynitride ($SiO_uN_v$, where u and v represent fractions of O and N, respectively), in which each of the screens is provided of a thickness from about 5–50 nm. The anneal is conducted in an ammonia ambient with the screen films intact. Nitridation arising from the screening film promotes vacancy formation in the silicon substrate surrounding the source/drain regions 40 & 42 and 46 & 48, thereby inhibiting diffusion in the vertical and lateral directions. Nitridation is accomplished using an $NH_3$ gas during source/drain anneal.

Figure 4:
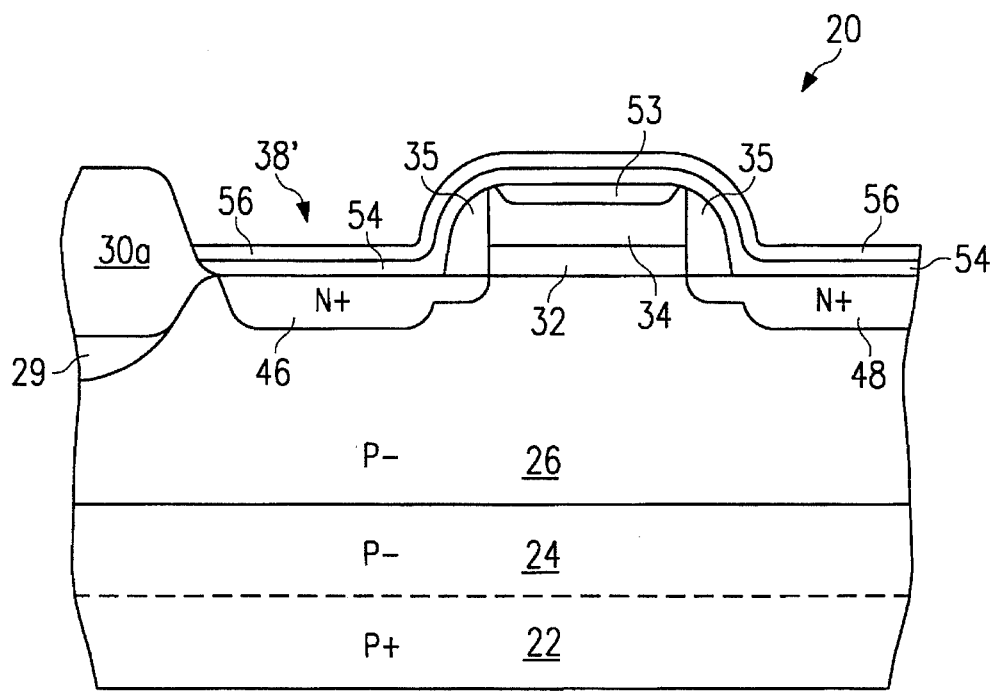
FIGS. 4 and 5 illustrate alternative, multicomponent blocking layers in accordance with the teachings of the present invention.

With reference to FIG. 4, there is depicted a further alternative aspect of the blocking layer 38 of the present invention. In this illustrated aspect of the invention, the blocking layer 38' comprises two films: an $SiO_2$ film 54 which is positioned adjacent to the source/drain 40/42 and 46/48, and an overlying, plasma- deposited silicon deficient silicon nitride film 56 having the composition $Si_3N_y$, in which y>4. The combination silicon nitride film 56 and underlying oxide films serve as an implant screening film which is operable to absorb silicon atoms from the underlying oxide film 54 which, in turn, absorbs silicon atoms from the underlying active regions 40/42 and 46/48. Absorption from the silicon atoms from the source/drain regions 40/42 and 46/48 results in a concommitment reduction in the number of silicon interstitials through which the implanted impurity can diffuse. The silicon-deficient silicon nitride can be produced either by plasma-assisted chemical vapor deposition or by a low pressure chemical vapor deposition process utilizing a ratio of $NH_3:SiH_2Cl_2$ of about 10:1 or greater. The underlying oxide film 54 can be produced by thermal oxidation, plasma-assisted deposition, or other conventional oxidation processes.

Figure 5:
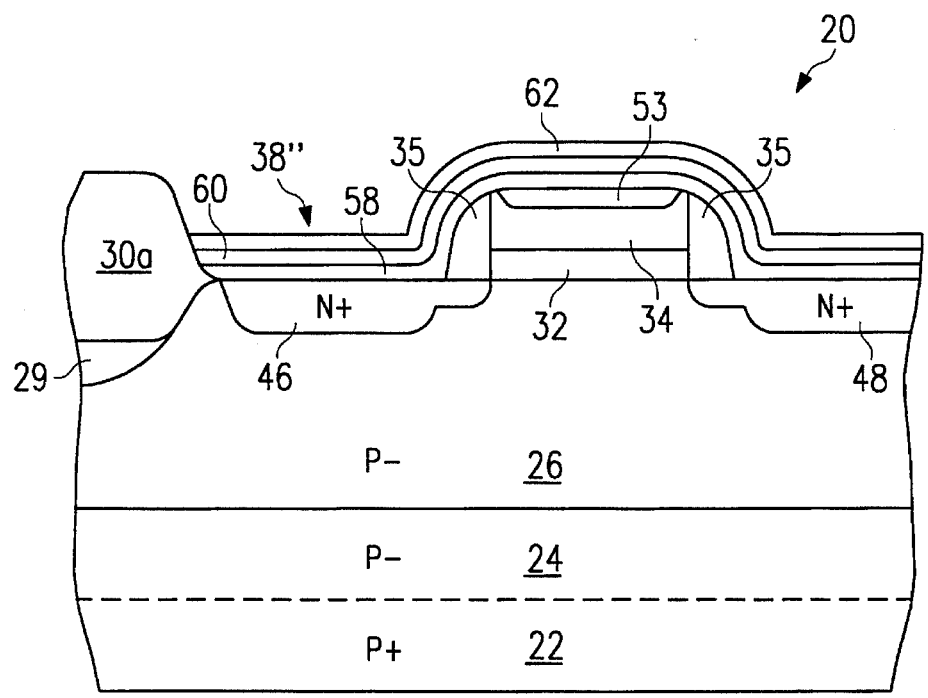

In a further, alternative aspect of the invention, as illustrated in FIG. 5, a 3-component blocking layer 38'' is depicted. The lowermost blocking layer film 58 comprises a silicon nitride film which, in turn, underlies an intermediate film 60 of $SiO_2$. A second $Si_3N_4$ film 62 overlies the $SiO_2$ film 60. The lower silicon nitride film can be deposited either by LPCVD or by plasma-enhanced deposition. In the latter case, it is preferable to configure the silicon nitride 58 as a silicon-deficient layer of the composition $Si_3N_y$ in which y>4. The use of a silicon-deficient nitride allows for the use of nitride stress to further suppress impurity diffusion. The stress arises from the disparity in expansion coefficients between the silicon nitride and the silicon along the upper service of the source/drain 40/42 and 46/48 when the semiconductor device is annealed. The uppermost silicon nitride film 62 is preferably deposited in an LPCVD process; however, other suitable deposition techniques can be utilized.

Any of the foregoing blocking layers 38, 38' and 38'' can be used in conjunction with an ammonia ambient during annealing. Nitridation due to the ammonia enhances vacancy formation, thereby further suppressing impurity diffusion.

Although the present invention and its advantages have been described in connection with the preferred embodiments, it should be understood that various changes, substitutions and alterations can be made herein without departing from the spirit and scope of the invention as defined by the appended claims.

What is claimed is:

1. A process for inhibiting dopant diffusion in a semiconductor material, comprising the steps of:

a. providing a semiconductor body having an upper surface and at least one unimplanted region devoid of dopant;

b. selecting a dopant for introduction into said semiconductor body to form at least one active region in said unimplanted region;

c. providing a dopant blocking layer in overlying relation with said at least one active region and introducing by way of a diffusion mechanism utilizing one of lattice vacancies or interstitial sites into said active region in accordance with the diffusion mechanism of said selected dopant;

d. introducing said selected dopant through said blocking layer and into said semiconductor body; and e. activating said introduced dopant by heating said semiconductor body.

2. The process according to claim 1, wherein said interstitial sites or lattice vacancies are introduced by adjusting the composition of said blocking layer.

3. The process according to claim 1, further comprising the step of applying a screen insulating layer prior to provision of said blocking layer.

4. The process according to claim 3, further comprising the step of removing said screen insulating layer prior to dopant activation.

5. The process according to claim 1, wherein said step of activating said implanted dopant comprises heating said semiconductor body to a temperature of at least about 800° C.

6. The process according to claim 1, wherein said dopants are introduced into said semiconductor body to create discrete source/drain regions.

7. The process according to claim 3, wherein said screen insulating layer comprises an oxide, nitride or oxynitride having a thickness of about 20–40 nm.

8. The process according to claim 1, wherein said blocking layer comprises a native oxide having a thickness of about 1–3 nm.

9. The process according to claim 1, wherein said semiconductor body is heated in an ammonia atmosphere.

10. The process according to claim 1, wherein said blocking layer comprises a silicon deficient oxide having the composition $SiO_x$, in which $x>2$.

11. The process according to claim 1, wherein said blocking layer comprises a silicon deficient oxynitride having the composition $SiO_uN_v$ that underlies a silicon nitride film, in which "u" and "v" represent fractional components selected to render a silicon deficient film.

12. The process according to claim 1, wherein said blocking layer comprises a screen oxide or a screen oxynitride having a thickness of about 5–50 nm and the semiconductor body is heated in an ammonia atmosphere.

13. The process according to claim 1, wherein said blocking layer comprises an oxide film that underlies a silicon nitride film having the composition $Si_3N_y$, in which $y>4$.

14. The process according to claim 13, wherein the silicon nitride is applied by one of plasma deposition or low pressure chemical vapor deposition utilizing an $NH_3:SiH_2Cl_2$ ratio of at least about 10:1.

15. The process according to claim 13, wherein said oxide film is applied by one of thermal oxidation or plasma-assisted deposition.

16. The process according to claim 1, wherein said blocking layer comprises a silicon nitride film having an $SiO_2$ overlay film which, in turn, underlies an $Si_3N_4$ film.

17. The process according to claim 16, wherein said lowermost silicon nitride film is applied by one of low pressure chemical vapor deposition or plasma enhanced deposition.

18. A process for inhibiting dopant diffusion in a semiconductor material comprising the steps of:
   a. providing a semiconductor body having an upper surface and at least one unimplanted region devoid of dopant;
   b. selecting a dopant for introduction into said semiconductor body to form at least one active region in said unimplanted region;
   c. introducing said dopant into said semiconductor body in a direction substantially transverse to said upper surface;
   d. providing a blocking layer in overlying relation with said at least one active region and introducing by way of a diffusion mechanism utilizing one of lattice vacancies or interstitial sites into said active regions in accordance with the diffusion mechanism of said selected dopant; and
   e. activating said implanted dopant by heating said semiconductor body.

19. The process according to claim 18, further comprising the step of applying a screen insulating layer to said semiconductor body upper surface prior to introduction of said dopant.

20. The process according to claim 19, wherein said step of activating said implanted dopant comprises heating said semiconductor body to a temperature of at least about 800° C.

* * * * *